United States Patent
Vankayala et al.

(10) Patent No.: US 8,958,256 B2
(45) Date of Patent: Feb. 17, 2015

(54) APPARATUSES AND METHODS FOR IMPROVED MEMORY OPERATION TIMES

(75) Inventors: Vijayakrishna J. Vankayala, Allen, TX (US); Gary Howe, Plano, TX (US); John Winegard, Plano, TX (US); Vipul Surlekar, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 290 days.

(21) Appl. No.: 13/443,661

(22) Filed: Apr. 10, 2012

(65) Prior Publication Data

US 2013/0265834 A1    Oct. 10, 2013

(51) Int. Cl.
*G11C 7/00* (2006.01)

(52) U.S. Cl.
USPC .......................... 365/205; 365/207

(58) Field of Classification Search
CPC ....................................... G11C 7/065
USPC .................. 365/205, 207, 210.1
See application file for complete search history.

(56) References Cited

U.S. PATENT DOCUMENTS

| | | | |
|---|---|---|---|
| 4,807,195 A * | 2/1989 | Busch et al. | 365/207 |
| 5,555,203 A * | 9/1996 | Shiratake et al. | 365/51 |
| 5,732,010 A | 3/1998 | Takashima et al. | |
| 5,969,980 A | 10/1999 | Allen | |
| 6,282,606 B1 | 8/2001 | Holland | |
| 6,768,686 B2 | 7/2004 | Frey | |
| 7,639,556 B2 * | 12/2009 | Yang et al. | 365/207 |
| 7,800,970 B2 * | 9/2010 | Hong et al. | 365/208 |
| 8,023,337 B2 | 9/2011 | Chung et al. | |
| 2002/0136067 A1 * | 9/2002 | Kojima | 365/200 |
| 2004/0017691 A1 | 1/2004 | Luk et al. | |
| 2006/0181917 A1 * | 8/2006 | Kang et al. | 365/149 |
| 2009/0010086 A1 * | 1/2009 | Hong et al. | 365/207 |
| 2010/0110747 A1 * | 5/2010 | Nakaoka et al. | 365/51 |
| 2010/0110782 A1 * | 5/2010 | Parkinson et al. | 365/163 |

* cited by examiner

*Primary Examiner* — Vu Le
(74) *Attorney, Agent, or Firm* — Dorsey & Whitney LLP

(57) ABSTRACT

Apparatuses and methods for improved memory cycle times are disclosed. An example apparatus may include first and second lines and a sense amplifier. The sense amplifier is directly coupled to the first and second lines. The sense amplifier may sense a differential signal between the first and second lines and amplify the same. An example method may include accessing a first memory cell coupled to a first line of a pair of lines and accessing a second memory cell coupled to a second line of the pair of lines. A differential is sensed between the pair of lines with a sense amplifier coupled directly to the pair of lines, and the sensed differential is amplified. The sense amplifier is coupled to an input/output bus to provide the amplified sensed differential to the input/output bus.

22 Claims, 6 Drawing Sheets

APPARATUSES AND METHODS FOR IMPROVED MEMORY OPERATION TIMES

TECHNICAL FIELD

Embodiments of this invention relate generally to memory devices, and more particularly, in one or more of the illustrated embodiments, to sense amplifiers.

BACKGROUND OF THE INVENTION

In various memories, data may be read from memory cells in respective memory sections and provided to external devices via lines, such as global data lines. Sense amplifiers are typically located at an end of these lines and are configured to sense data on the lines in response to one or more control signals and amplify the data. Typically, sense amplifiers are shared between multiple sets of lines and are selectively coupled to individual sets during memory operations, allowing the sense amplifiers to sense data on one set of lines at a time. For example, sense amplifiers may be selectively coupled to the sets of lines of two different sections of memory with which the sense amplifiers are shared.

As memory density and complexity has increased over time, the data lines extending through memories have increased in both length and number. Line length in particular has been a design constraint. For example, the greater the line length the greater the amount of time required to pre-charge the line and the further a line extends from a sense amplifier the greater the amount of time required to drive the line to a condition that may be accurately sensed by the sense amplifier.

In the past, one approach to solve this issue has been to shorten the length of lines extending through memory sections. Although this may reduce the time needed to change the signal states on lines, this approach is not always a feasible solution to achieve necessary reduction in memory timings. For example, having shorter lines may require more sets of sense amplifiers to provide a memory density comparable to memories having fewer sets of sense amplifiers and longer lines. Moreover, additional design constraints have arisen from increased complexity in memories, for example, control logic used to couple and decouple sense amplifiers from lines. In accounting for this additional complexity, memory timings must be relaxed, and achieving desired memory performance is more difficult.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
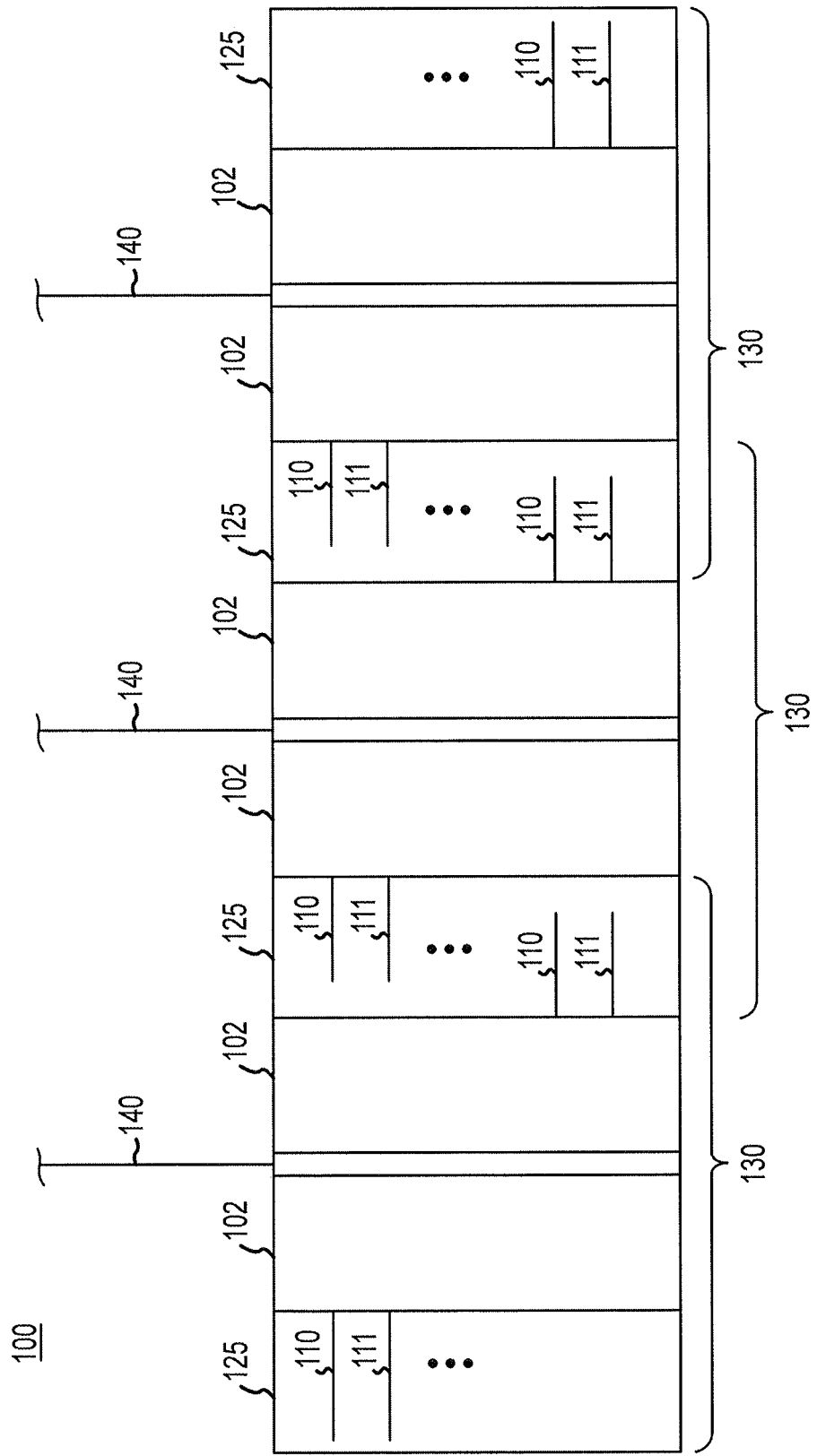
FIG. 1 illustrates a block diagram of an apparatus according to an embodiment of the invention.

FIG. 1 illustrates a block diagram of an apparatus 100 according to an embodiment of the invention. The apparatus 100 may include a plurality of sense amplification blocks 102, a plurality of pairs of lines 110, 111, and a plurality of input/output (I/O) buses 140. The sense amplifiers of the plurality of sense amplification blocks 102 may comprise one or more sense amplifiers (not shown in FIG. 1) that may be voltage sense amplifiers, current mode sense amplifiers, or any other type of sense amplifier known by those having ordinary skill in the art. The sense amplification blocks 102 may further include circuits for use with the sense amplifiers. As will be explained in detail below, the circuits may, for instance, comprise a column select circuits and/or a pre-charge circuits.

The I/O buses 140 may be coupled to the sense amplifiers of one or more respective sense amplification blocks 102, and the sense amplifiers of the sense amplification blocks 102 may be coupled to respective pairs of lines 110, 111 extending through corresponding memory sections 125. Each I/O bus 140 may be configured to conduct signals between one or more of the sense amplifiers of the sense amplification blocks 102 and one or more other circuits (not shown in FIG. 1), such as an input/output data path and/or an address decoder. The I/O busses 140 may comprise any bit width and may be configured to couple data signals. In some embodiments, the I/O busses 140 may have same bit widths, or may have different bit widths.

The plurality of sense amplification blocks 102 may be arranged in one or more sets 130, and each set may share an I/O bus 140. Each set 130, for example, may comprise a pair of sense amplification blocks 102. In one embodiment, each set 130 of the sense amplification blocks 102 may be configured such that a sense amplifier of one sense amplification block 102 of the set 130 is selectively coupled to a respective I/O bus 140 at a time. Each of the sense amplifiers of the selectively coupled sense amplification block 102 may receive signals from and/or provide signals to respective I/O busses 140, while the sense amplifiers of the other sense amplification block 102 of a set 130 may be selectively decoupled (e.g., electrically isolated) from the I/O busses 140 such that one or more signals cannot be received from or provided to the I/O busses 140. Moreover, sense amplifiers of the sense amplification blocks 102 may be selectively coupled to I/O busses 140 based, at least in part, on one or more control signals, such as a column select signal. As an example, column select circuits of each sense amplification block 102 in a set 130 may receive a respective column select signal, allowing sense amplifiers of the sense amplification blocks 102 to be individually coupled or decoupled from a respective I/O bus 140.

The lines 110, 111 are coupled to respective memory cells and may be configured to conduct signals between the respective memory cells and a respective sense amplifier of the sense amplification block 102. As known, each pair of lines 110, 111 may comprise a differential pair of lines and may be used to conduct complementary and/or differential signals. Each line 110, 111 may comprise any length and may have an impedance (e.g., resistance and/or capacitance) which may be distributed over the length of the line. The lines 110, 111 may be, for instance, bit lines, and in particular, relatively long bit lines. In one embodiment, each pair of the lines 110, 111 may extend through a respective memory section 125. Within the memory section 125, one line 110, 111 of a pair may, for instance, be coupled to a first memory cell (not shown in FIG. 1), and the other line 110, 111 may be coupled to a second memory cell (not shown in FIG. 1), such as a reference memory cell. In some embodiments, the first and second memory cells store complementary data. Accordingly, the lines 110, 111 may provide complementary signals from a same section of a memory array, and in some embodiments, lines 110, 111 may further provide signals from memory cells corresponding to a same wordline. The lines 110, 111 may further be arranged in any configuration. For example, as illustrated in FIG. 1, each pair of lines 110, 111 may be adjacent and/or parallel in extending through a memory section 125.

In conventional implementations, as previously discussed, a sense amplifier may be configured to be shared between sets of lines of different memory sections and selectively coupled to one of a plurality of sets of lines during a memory operation, allowing data to be sensed on a particular set of lines of one of the memory sections at a given time. This approach is often accomplished using, for example, isolation transistors that may be coupled to each line and may be activated and deactivated with respective control signals. However, use of isolation transistors in this manner can increase the time required to perform memory operations, such as read operations, as time is spent coupling and decoupling lines from the sense amplifier. Thus, as will be explained in more detail below, memory operation times may be decreased based, at least in part, on a respective sense amplifier of a sense amplification block 102 being dedicated to each pair of lines 110, 111, thereby eliminating the need to selectively couple lines to a sense amplifier that is shared with another set of lines. As an example, in an embodiment, lines 110, 111 may be directly coupled to sense amplifiers of sense amplification blocks 102 without being coupled to isolation transistors. This may, for instance, improve the rate at which lines 110, 111 may be charged and/or discharged.

In an example operation of the apparatus 100, lines 110, 111 may be pre-charged to a pre-charge voltage, such as a voltage having a magnitude greater than a reference voltage (e.g., VSS or ground) and less than a supply voltage (e.g., VCC). The pre-charge voltage may, for instance, be approximately one-half of the supply voltage (e.g., VCC/2). Once lines 110, 111 have been pre-charged, data stored in memory cells may be sensed by the sense amplifiers of a sense amplification block 102. In particular, following the pre-charging of lines 110, 111, a word line (not shown in FIG. 1) may be enabled, thereby accessing memory cells coupled to the lines 110, 111 causing the voltage on the lines 110, 111 to change from the pre-charge voltage based, at least in part, on data stored in respective memory cells. The voltage of a line 110, 111 may, for example, increase above the pre-charge voltage, and the other line 110, 111 may decrease below the pre-charge voltage. The sense amplifiers of sense amplification block 102 may sense the differential voltage between the lines 110, 111 and provide (e.g., drive) corresponding signal levels to an I/O bus 140. In at least one embodiment, the sense amplifiers of sense amplification block 102 may sense the signal levels responsive, at least in part, to one or more control signals.

As previously discussed, the lines 110, 111 may have a respective dedicated sense amplifier, improving the rates at which the lines 110, 111 are charged and discharged. As an example, because individual pairs of lines 110, 111 are not selectively coupled and/or decoupled from the respective sense amplifier, lines 110, 111 may, for instance, be pre-charged and/or data may be sensed without first coupling and/or decoupling pairs of lines from a sense amplifier. In one embodiment, this may be implemented by directly coupling each pair of lines 110, 111 to a dedicated sense amplifier rather than through isolation transistors, as will be described in more detail below.

Figure 2:
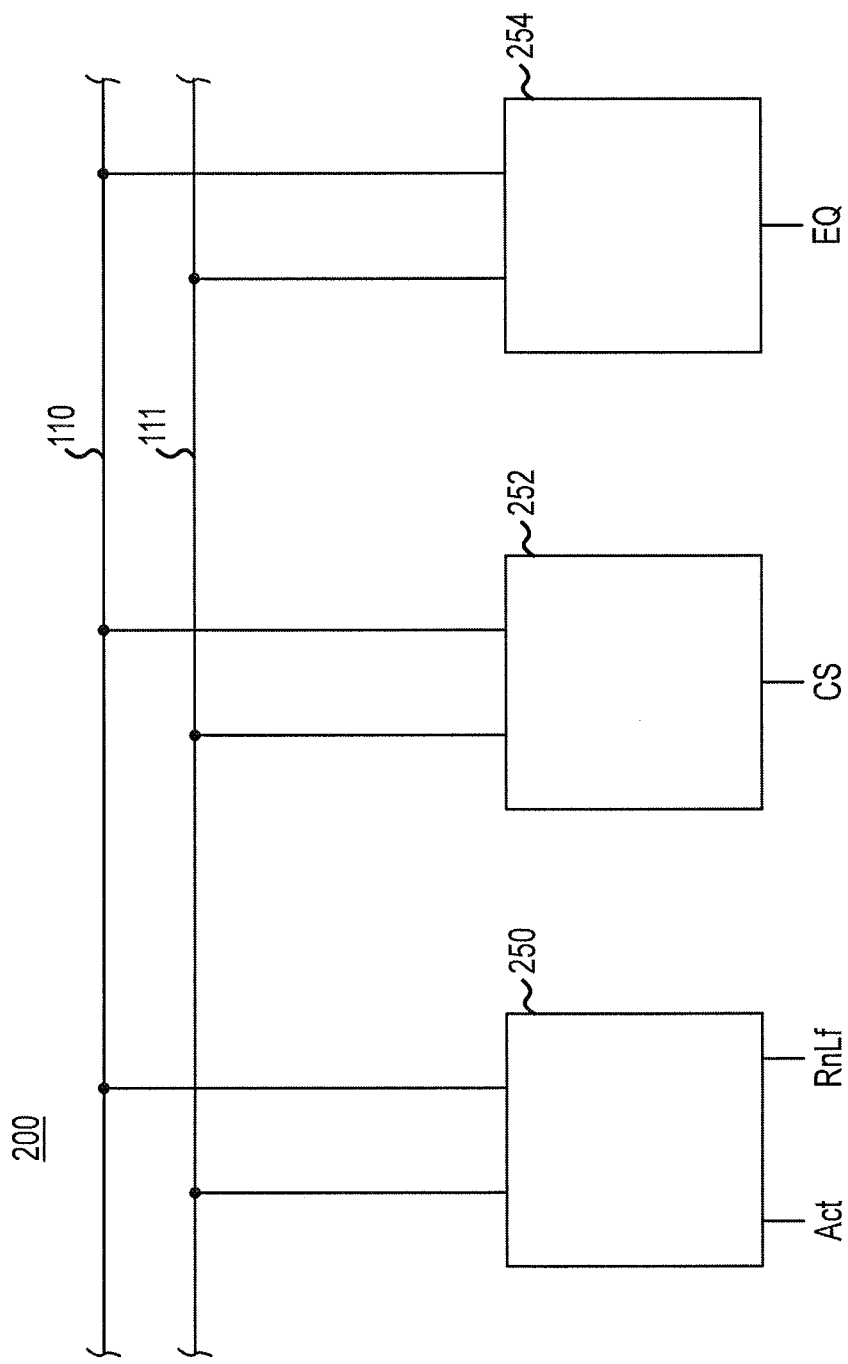
FIG. 2 illustrates a block diagram of a sense amplification block that may be used in the apparatus of FIG. 1 according to an embodiment of the invention.

FIG. 2 illustrates a block diagram of a portion of a sense amplification block 200 according to an embodiment of the invention that may be used in the apparatus 100 of FIG. 1. The sense amplification block 200 may include a sense amplifier 250, a column select circuit 252, and a pre-charge circuit 254, each of which may be coupled to the lines 110, 111. The sense amplifier 250 may be configured to receive control signals Act and RnLf, the column select circuit 252 may be configured receive a column select signal CS, and the pre-charge circuit 254 may be configured to receive an equalization signal EQ. The signals provided to the respective elements in the sense amplification block 200 are conventional, and may, for instance, be provided via conventional control circuitry. In another embodiment, any number of the signals may be provided by one or more other busses (not shown).

In an example operation of the sense amplification block 200, an equalization signal EQ may be provided to the pre-charge circuit 254. Responsive, at least in part, to receipt of the EQ signal, the pre-charge circuit 254 may cause lines 110, 111 to have a substantially same voltage. The lines 110, 111, for example, may both be pre-charged to a voltage between a supply voltage and a reference voltage, as described above. Once lines 110, 111 have been pre-charged, memory cells may be accessed. In particular, a word line may be enabled, thereby accessing, for example, a memory cell and a reference cell, coupled to the lines 110, 111, respectively. As previously discussed, this may cause the voltage levels of lines 110, 111 to change from the pre-charge voltage based, at least in part, on data stored in the memory cells. Responsive, at least in part, to receipt of RnLf and Act signals, the sense amplifier 250 may sense the differential voltage between lines 110, 111. The column select signal CS may be provided to the column select circuit 252, thereby coupling the lines 110, 111 to a respective I/O bus 140 (not shown) via the column select circuit 252, and allowing the sense amplifier 250 to provide (e.g., drive) corresponding signals onto the I/O bus 140.

The sense amplification block 200 may include a plurality of the sets of the sense amplifier 250, the column select circuit 252, and the pre-charge circuit 254 as shown in FIG. 2. Each of the sense amplifiers 250 may be coupled to the I/O bus 140. In some embodiments, each pair of lines 110, 111 may be coupled to a respective column select circuit 252, and pre-charge circuit 254. In other embodiments, the column select circuit 252, and pre-charge circuit 254 may be shared between a plurality of pairs of lines 110, 111. Although not shown, the I/O bus 140 may be shared with sense amplifiers of another sense amplification block. The column select circuits 252 may be used to isolate a sense amplifier 250 from the I/O bus 140 when a sense amplifier of the other sense amplification block is coupled.

As discussed, the pairs of lines 110, 111 may have a respective dedicated sense amplifier, for example, by being directly coupled to a sense amplifier and/or extend through respective memory sections. Referring to FIG. 1, in particular, each pair of lines 110, 111 extending through a memory section may be interleaved with other pairs of lines 110, 111 coupled to a respective dedicated sense amplifier of a different sense amplification block 102 and extend through the same memory section. However, lines 110, 111 may also be arranged in other ways as well.

Figure 3:
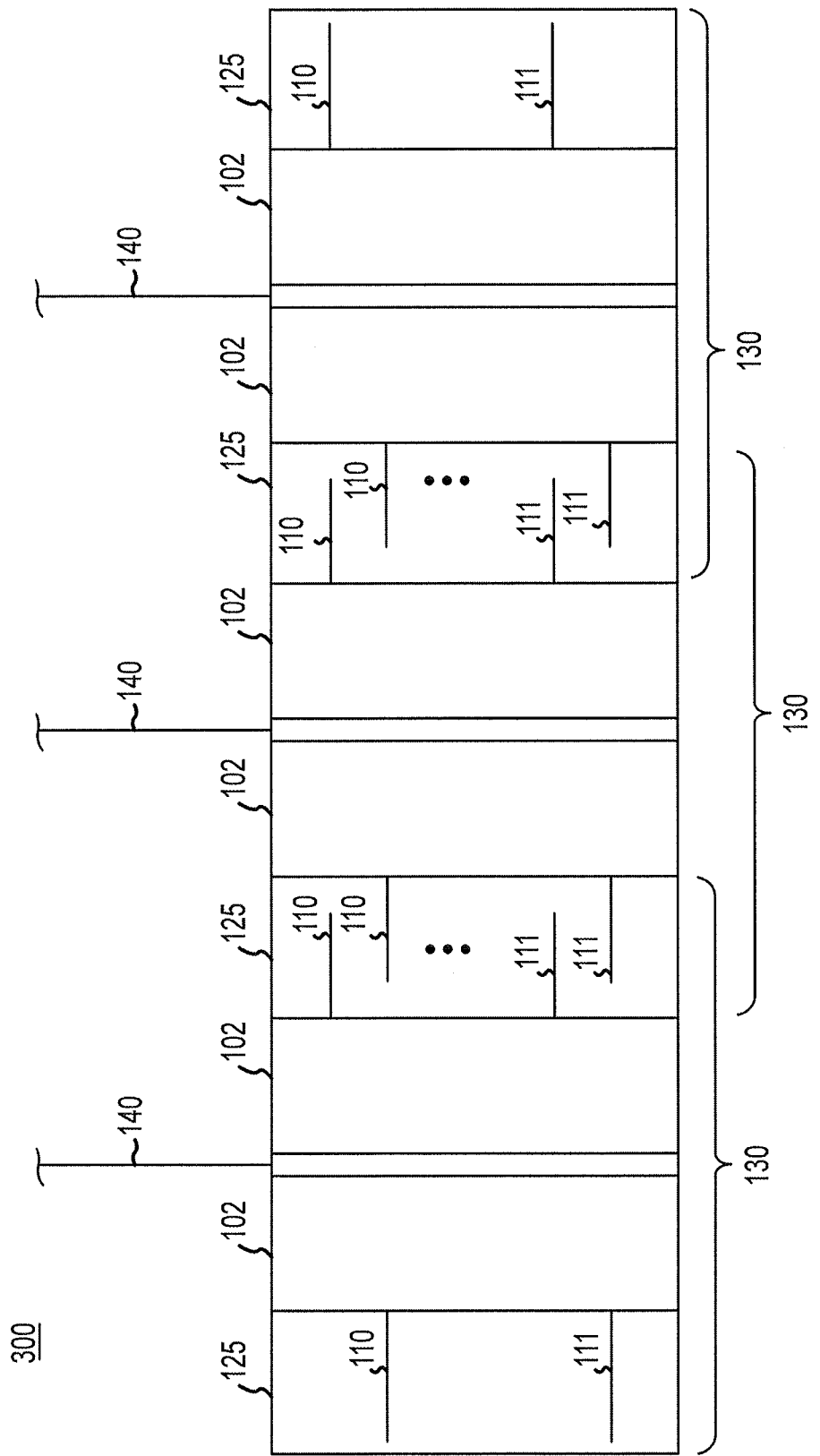
FIG. 3 illustrates a block diagram of an apparatus according to an embodiment of the invention.

FIG. 3, for instance, illustrates a block diagram of an apparatus 300 according to an embodiment of the invention. The apparatus 300 includes elements that have been previously described with respect to the apparatus 100 of FIG. 1. Those elements have been identified in FIG. 3 using the same reference numbers used in FIG. 1 and operation of the common elements is as previously described. Consequently, a detailed description of the operation of these elements will not be repeated in the interest of brevity.

In contrast to the apparatus 100, individual lines 110, 111 of the apparatus 300 may be interleaved. That is, the lines 110, 111 of the apparatus 300 may be coupled to a respective sense amplifiers of sense amplification block 102 such that each line 110, 111 is adjacent to lines 110, 111 coupled to a sense amplifier of a different sense amplification block 102. In some embodiments, lines 110, 111 extending through each section 125 may be interleaved in different manners or may not be interleaved at all. It will be appreciated by those having skill in the art that other implementations may be used without departing from the scope and spirit of the invention.

Figure 4:
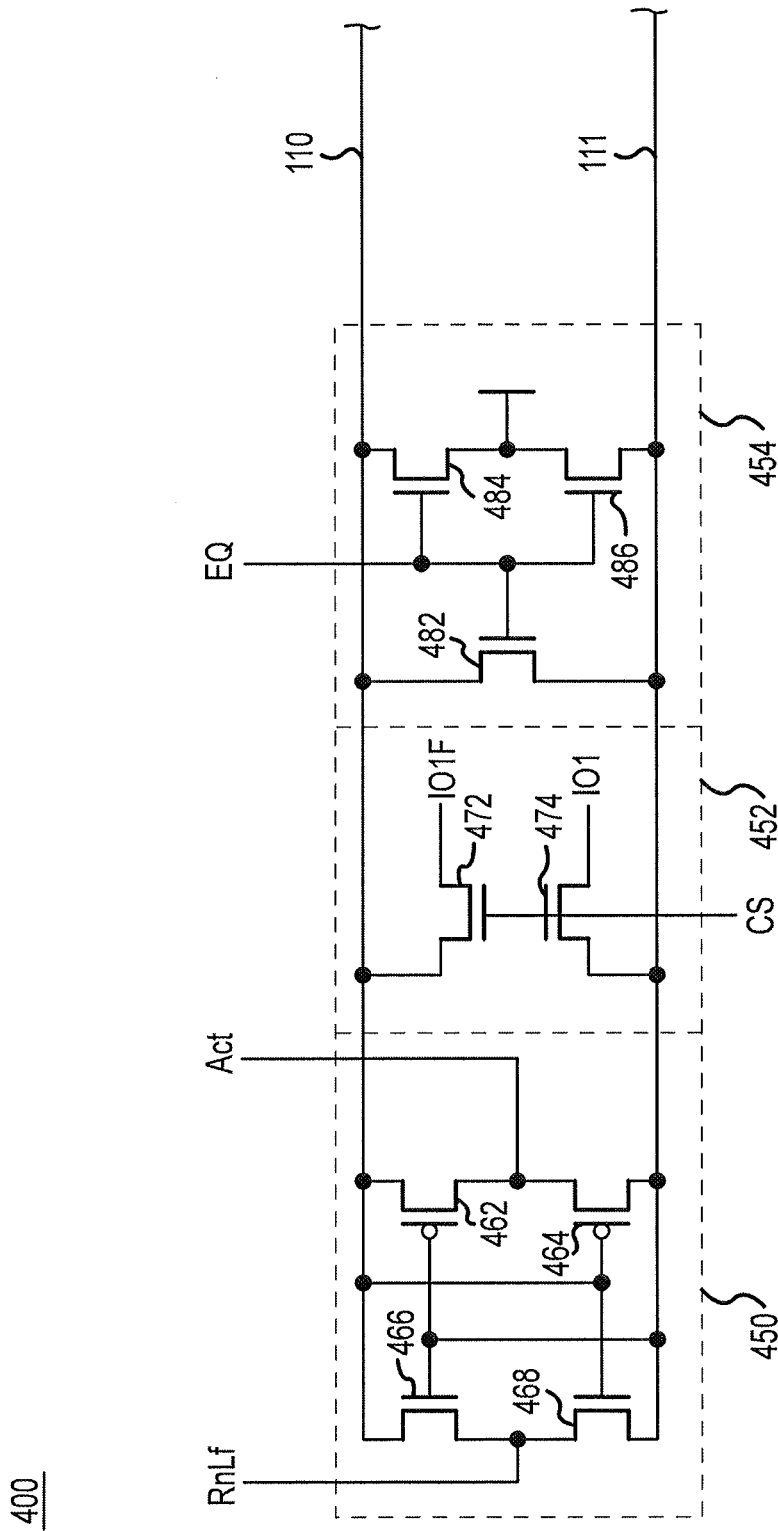
FIG. 4 illustrates a block diagram of a sense amplification block that may be used in the apparatus of FIG. 1 according to an embodiment of the invention.

FIG. 4 illustrates a block diagram of a portion of a sense amplification block 400 according to an embodiment of the invention that may be used in the apparatus 100 of FIG. 1. The sense amplification block 400 may include a sense amplifier 450, a column select circuit 452, and a pre-charge circuit 454.

The sense amplifier 450 may include a pair of cross-coupled p-channel field effect transistors (pFETs) 462, 464, the sources of which are coupled to a node to which the control signal Act may be provided during operation. The Act signal may be provided, for example, from a power supply voltage (not shown). The sense amplifier 450 may further include cross-coupled n-channel field effect transistors (nFETs) 466, 468 having drains coupled to a common node to which the control signal RnLf may be provided during operation. The RnLf signal may be, for instance, ground.

The column select circuit 452 may include transistors (e.g., field effect transistor or bipolar junction transistor) 472, 474 that may, for example, be nFETs. The gates of transistors 472, 474 may be coupled to a node to which the column select signal CS may be provided during operation. The pre-charge circuit 454 may include transistors 482, 484, and 486, that may be, for instance, nFETs, or may be any other type of transistor known by those having ordinary skill in the art. The gates of transistors 482, 484, and 486 may share a common node to which the equalization signal EQ may be applied during operation. Transistors 484, 486 may be coupled in series between lines 110, 111, and the transistor 482 may be coupled between the lines 110, 111. Moreover, the drains of transistors 484, 486 may be coupled to a node wherein a pre-charge voltage may be applied during operation of the apparatus 400.

In an example operation of the apparatus 400, an active equalization signal EQ may be provided to pre-charge circuit 454. Responsive, at least in part, to receipt of the active EQ signal, the transistor 482 may be enabled, thereby coupling lines 110, 111 together. Transistors 484, 486 may also be enabled, causing lines 110, 111 to be charged to a pre-charge voltage (e.g., VCC/2). Thus, in providing the active EQ signal, the voltages between lines 110, 111 may be charged to the pre-charge voltage and approximately equalized. Once lines 110, 111 have been pre-charged, lines 110, 111 may be electrically isolated by providing an inactive EQ signal. A word line (not shown) may be enabled and to access memory cells to access to the lines 110, 111, and the sense amplifier 450 may sense the differential voltage between the lines 110, 111.

In response to the word line activating, one of the lines 110, 111 will increase in voltage and the other will decrease based, at least in part, on the respective data stored in accessed memory cells.

If the voltage level of line 110 increases, for example, the gate-to-source voltage of the transistor 468 may be greater than that of the transistor 466. An active RnLf signal may be provided, driving the common node of the transistors 466, 468 to ground, and enabling transistor 468. Because transistor 468 may be enabled, line 111 may be pulled to ground, and the gate-to-source voltage of the transistor 462 may increase. An active Act signal may be provided, enabling the transistor 462. The line 110 may be coupled to a power supply voltage as a result and the transistor 462 may drive the line 110 toward the power supply voltage. Thereafter, the line 110 may further increase in voltage and the line 111 may further decrease. Once the lines 110, 111 have been sufficiently driven, an active column select signal CS may be provided to the column select circuit 252, allowing the sense amplifier 250 to drive corresponding signals of lines 110, 111 onto lines IO1F and I01, respectively, of the I/O bus 140.

Figure 5:
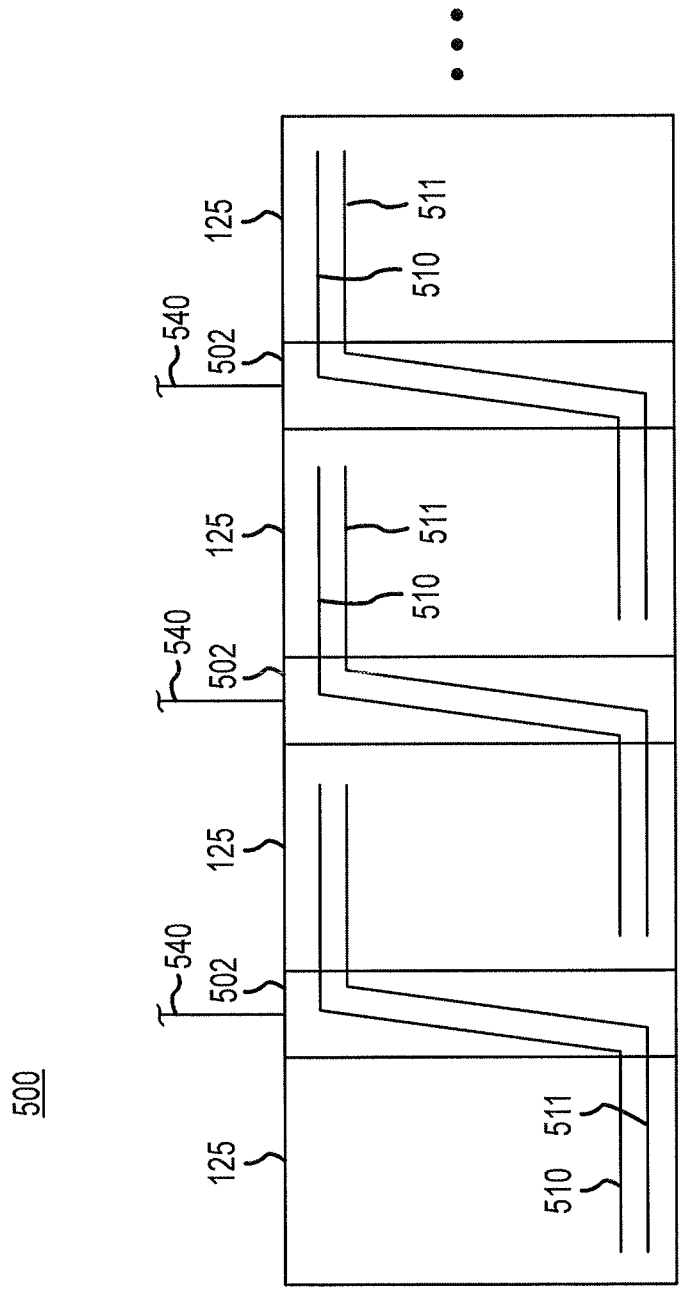
FIG. 5 illustrates a block diagram of an apparatus according to an embodiment of the invention.

As described above, lines 110, 111 may be coupled to a respective sense amplifier of a sense amplification block 102 and extend through memory sections therefrom. However, it may be desirable, for instance, to couple sense amplifiers at various locations along the lengths of lines 110, 111. FIG. 5 illustrates a block diagram of an apparatus 500 in accordance with an embodiment of the invention. The apparatus 500 may include a plurality of sense amplification blocks 502 that may be coupled to respective pairs of lines 110, 111 and I/O busses 540. The lines 510, 511, I/O busses 540, and sense amplification blocks 502 may be similar to the lines 110, 111, I/O busses 140 of FIG. 1, and the sense amplification blocks 102 of FIG. 1, respectively.

Each of the plurality of sense amplification blocks 502 may comprise one or more sense amplifiers (not shown in FIG. 5) that may be differential sense amplifiers, current mode sense amplifiers, or any other type of sense amplifier known by those having ordinary skill in the art. The sense amplification blocks 502 may further include circuits for use with the sense amplifiers. As will be explained in detail below, the circuits may, for instance, comprise a column select circuit and/or a pre-charge circuit, such as the pre-charge circuit 254 and the column select circuit 252 of FIG. 2.

The sense amplifiers of the sense amplification blocks 502 may be coupled to a respective pair of lines 510, 511 at a point along a length of each of the lines 510, 511, and may for instance, be dedicated to the respective pair of lines 510, 511, thereby eliminating the need to selectively couple lines to a sense amplifier that is shared with another set of lines. As an example, in an embodiment, lines 510, 511 may be directly coupled to a respective sense amplifier of sense amplification blocks 502 without being coupled to isolation transistors. Sense amplifiers of a sense amplification block 502 may, for example, be coupled at approximately the midpoint of the lines 510, 511, or at any other point along the length of the lines 510, 511. Because the sense amplifiers of sense amplification block 502 may be coupled along the length of respective lines 510, 511, in at least one embodiment, each pair of lines 510, 511 may be configured to extend through multiple memory sections 125, for example, the memory sections 125 adjacent to a sense amplification block 502 having sense amplifiers to which respective lines 510, 511 are coupled. Moreover, each sense amplifier of the sense amplification blocks 502 may be coupled to a respective I/O bus 540 or may share a respective I/O bus 540 with one or more sense amplifiers.

In an example operation of the apparatus 500, lines 510, 511 may be pre-charged by pre-charge circuits in the respective sense amplification blocks 502. As described above, a word line may be enabled to access memory cells coupled to respective lines 510, 511, thereby changing the voltages of the lines 510, 511 such that the voltage level of one line increases and the voltage level of the other line decreases from a pre-charge voltage. The respective sense amplifier of the sense amplification block 502 may sense the new voltage differential, amplify the voltages of the lines 510, 511, and a selected sense amplifier may provide corresponding signals to a respective I/O bus 540. The corresponding signals may be provided to the respective I/O bus 540, for instance, responsive, at least in part, to receipt of a column select signal.

Because the sense amplifiers of each sense amplification block 502 may be coupled to lines 510, 511 at any point along the lengths of lines 510, 511, the resistive load between a respective sense amplifier and a memory cell (not shown in FIG. 5) positioned nearest the end of a line 510, 511 may be reduced. For example, in an embodiment having sense amplifiers coupled approximately at midpoints for the lines 510, 511, the distance between a sense amplifier and the end of the lines 510, 511 will be approximately halved. As a result, memory array cycle times may be improved because of the reduced resistive load. That is, in at least one embodiment, by coupling sense amplifiers of a sense amplification block 502 to a point along the length of a line 510, 511, such as approximately at the midpoint of lines 510, 511, the time required to execute a memory operation may be reduced. For example, during a read operation, the time required to pre-charge lines 510, 511, and/or sense a differential voltage on lines 510, 511 may be reduced due to the reduced resistance load.

Figure 6:
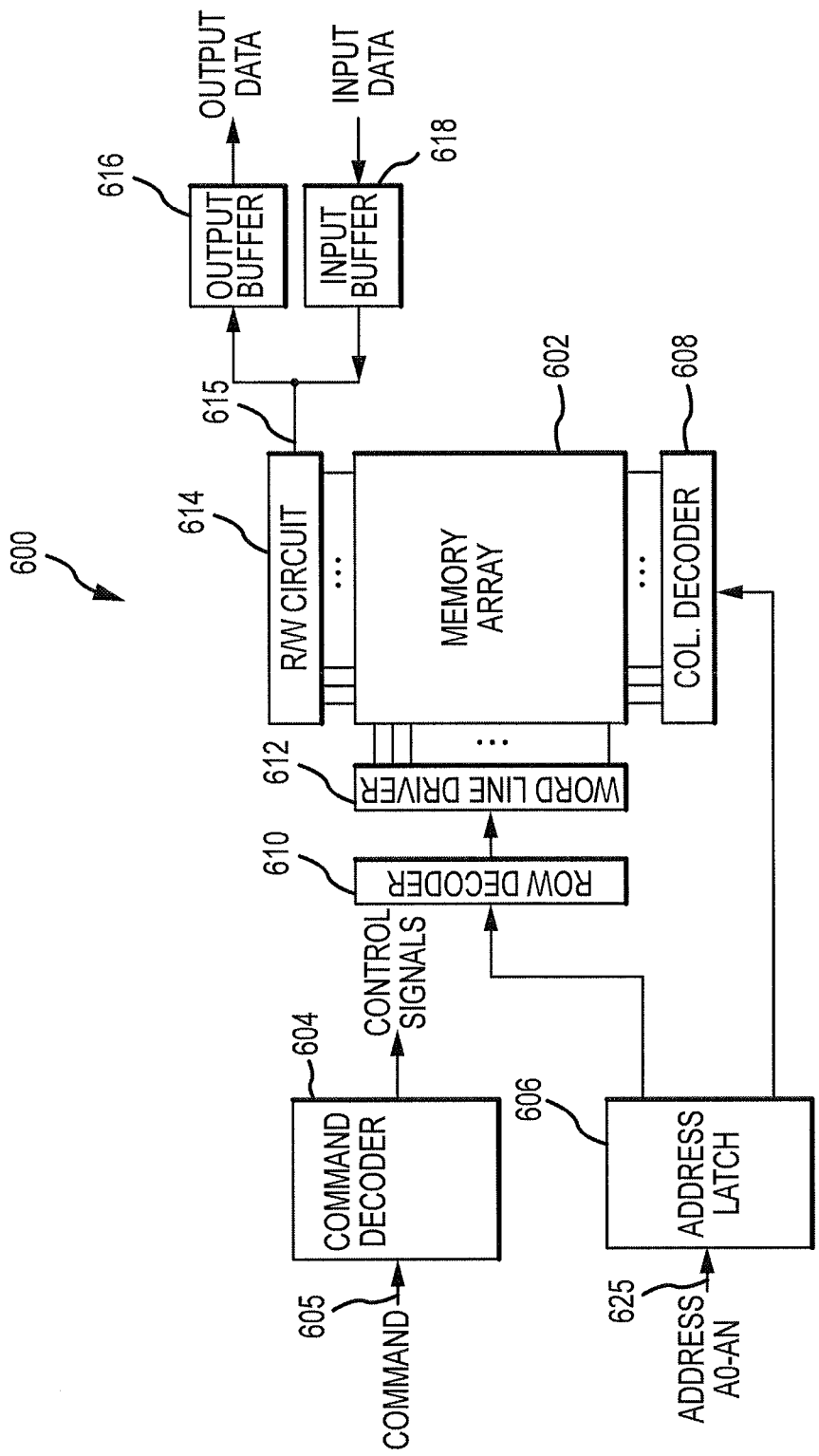
FIG. 6 illustrates part of a memory that may include the apparatus of FIG. 1 according to an embodiment of the invention.

FIG. 6 illustrates part of a memory 600 that may include the apparatus 100 of FIG. 1 according to an embodiment of the invention. The memory 600 includes an array 602 of memory cells, which may be, for example, DRAM memory cells, SRAM memory cells, flash memory cells, or some other types of memory cells. The memory 600 includes an address/command decoder 604 that receives memory commands and addresses through an ADDR/CMD bus. The address/command decoder 604 generates control signals, based on the commands received through the ADDR/CMD bus. The address/command decoder 604 also provides row and column addresses to the memory 600 through an address bus and an address latch 606. The address latch then outputs separate column addresses and separate row addresses.

The row and column addresses are provided by the address latch 606 to a row address decoder 610 and a column address decoder 608, respectively. The column address decoder 608 selects lines extending through the array 602 corresponding to respective column addresses. The row address decoder 610 is connected to word line driver 612 that activates respective rows of memory cells in the array 602 corresponding to received row addresses. The selected line (e.g., a bit line or bit lines) corresponding to a received column address are coupled to a read/write circuitry 614 to provide read data to a data output circuit 616 via an input-output data bus 615. Write data are provided to the memory array 602 through a data input circuit 618 and the memory array read/write circuitry 614.

At least a portion of the memory 600 may include an apparatus (not shown), which may be similar to any of the apparatuses, such as the apparatus 100 or the apparatus 500, described above. The apparatus may be included in the memory array 602 and/or the read/write circuitry 614, or in any other location in the memory 600.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   an input/output bus;
   first and second lines; and
   a sense amplifier directly coupled to the first and second lines, the sense amplifier configured to sense a differential signal between the first and second lines and amplify the same,
   wherein the sense amplifier is further configured to be selectively coupled to the input/output bus based, at least in part, on a column select signal and wherein the sense amplifier is further configured to provide the differential signal to the input/output bus.

2. The apparatus of claim 1, wherein the apparatus is included in a memory.

3. The apparatus of claim 1, wherein the first and second lines are interleaved with a third line directly coupled to another sense amplifier.

4. The apparatus of claim 1, wherein the sense amplifier comprises a current mode sense amplifier.

5. The apparatus of claim 1, wherein the sense amplifier comprises a voltage sense amplifier.

6. The apparatus of claim 4, further comprising a pre-charge circuit configured to cause the first and second lines to have a pre-charge voltage responsive, at least in part, to receipt of an active equalization signal.

7. The apparatus of claim 1, wherein the first and second lines are complementary.

8. The apparatus of claim 1, wherein the sense amplifier is directly coupled to the first and second lines at approximately a midpoint of the first and second lines.

9. The apparatus of claim 1, wherein the first and second lines extend through a memory section and are coupled to a memory cell and a reference memory cell, respectively.

10. An apparatus, comprising:
    an input/output bus;
    a plurality of lines;
    a column select circuit; and
    a plurality of sense amplifiers, each sense amplifier directly coupled to a respective pair of the plurality of lines of one memory section and configured to be selectively coupled to the input/output bus through the column select circuit.

11. The apparatus of claim 10, wherein the column select circuit is selectively enabled by a respective column select signal provided by an address decoder.

12. The apparatus of claim 10, wherein the plurality of lines are a first plurality of lines, the plurality of sense amplifiers are a first plurality of sense amplifiers, and the one memory section comprises a first memory section, the apparatus further comprising:
    a second plurality of lines of a
    a second memory section; and
    a second plurality of sense amplifiers, each sense amplifier of the second plurality coupled to a respective pair of the second plurality of lines of the second memory section and further selectively coupled to the input/output bus through a second column select circuit, and wherein the first and second plurality of sense amplifiers share the input/output bus.

13. An apparatus, comprising:
   first and second lines; and
   a sense amplifier directly coupled to the first and second lines,
   wherein the sense amplifier is positioned at approximately a midpoint along the lengths of each of the first and second lines and wherein each of the first and second lines extend through a plurality of memory sections.

14. The apparatus of claim 13, wherein the sense amplifier is configured to provide signals corresponding to the signal levels of the first and second lines responsive, at least in part, to receipt of a column select signal.

15. The apparatus of claim 13, wherein one of the plurality of memory sections includes a memory cell and a reference memory cell, the memory cell and reference memory cell coupled to the first and second lines, respectively.

16. A method, comprising:
   accessing a first memory cell coupled to a first line of a pair of lines and accessing a second memory cell coupled to a second line of the pair of lines;
   sensing a differential between the pair of lines with a sense amplifier coupled directly to the pair of lines;
   amplifying the sensed differential; and
   selectively coupling the sense amplifier to an input/output bus to provide the amplified sensed differential to the input/output bus.

17. The method of claim 16, wherein said coupling the sense amplifier, comprises:
   receiving an active column select signal; and
   enabling a transistor responsive, at least in part, to receipt of the active column select signal.

18. The method of claim 16, further comprising storing a first data in the first memory cell and storing a second data in the second memory cell, wherein the first and second data are complementary.

19. The method of claim 16, wherein the first and second lines of the pair of lines are interleaved with third and fourth lines of another pair of lines.

20. A method, comprising:
   sensing a differential signal at an approximate midpoint of a first line and an approximate midpoint of a second line, wherein each of the first and second lines extend through a plurality of memory sections; and
   providing an amplified signal based, at least in part, on the sensed differential signal to a bus.

21. The method of claim 20, wherein the differential signal is based, at least in part, on data stored in a memory cell and a reference memory cell, wherein the memory cell and the reference memory cell correspond to a same memory section.

22. The method of claim 20, wherein to first portion of the first and second lines extend through a first memory section and a second portion of the first and second lines extend through a second memory section.

* * * * *

UNITED STATES PATENT AND TRADEMARK OFFICE
CERTIFICATE OF CORRECTION

| | | |
|---|---|---|
| PATENT NO. | : 8,958,256 B2 | Page 1 of 1 |
| APPLICATION NO. | : 13/443661 | |
| DATED | : February 17, 2015 | |
| INVENTOR(S) | : Vijayakrishna J. Vankayala et al. | |

It is certified that error appears in the above-identified patent and that said Letters Patent is hereby corrected as shown below:

In the claims,

In column 8, line 59, in Claim 12, delete "of a" and insert -- of --, therefor.

In column 10, line 23, in Claim 22, delete "to" and insert -- a --, therefor.

Signed and Sealed this
Fifth Day of May, 2015

Michelle K. Lee
*Director of the United States Patent and Trademark Office*